US011694713B2

(12) United States Patent
Le et al.

(10) Patent No.: US 11,694,713 B2
(45) Date of Patent: Jul. 4, 2023

(54) BISB TOPOLOGICAL INSULATOR WITH NOVEL BUFFER LAYER THAT PROMOTES A BISB (012) ORIENTATION

(71) Applicants: Western Digital Technologies, Inc., San Jose, CA (US); Tokyo Institute of Technology, Tokyo (JP)

(72) Inventors: Quang Le, San Jose, CA (US); Cherngye Hwang, San Jose, CA (US); Brian R. York, San Jose, CA (US); Thao A. Nguyen, San Jose, CA (US); Zheng Gao, San Jose, CA (US); Kuok San Ho, Emerald Hills, CA (US); Pham Nam Hai, Tokyo (JP)

(73) Assignee: Western Digital Technologies, Inc., San Jose, CA (US)

( * ) Notice: Subject to any disclaimer, the term of this patent is extended or adjusted under 35 U.S.C. 154(b) by 204 days.

(21) Appl. No.: 17/100,199

(22) Filed: Nov. 20, 2020

(65) Prior Publication Data
US 2021/0249038 A1 Aug. 12, 2021

Related U.S. Application Data

(60) Provisional application No. 62/975,661, filed on Feb. 12, 2020.

(51) Int. Cl.
*G11B 5/11* (2006.01)
*H01F 10/32* (2006.01)
(Continued)

(52) U.S. Cl.
CPC ............ *G11B 5/11* (2013.01); *G11B 5/147* (2013.01); *H01F 10/329* (2013.01);
(Continued)

(58) Field of Classification Search
None
See application file for complete search history.

(56) References Cited

U.S. PATENT DOCUMENTS 11,094,338 B1 * 8/2021 Hwang ............... G11B 5/11
11,489,108 B2 * 11/2022 Le ....................... H01L 43/10
(Continued)

FOREIGN PATENT DOCUMENTS

JP 2021057357 A 4/2021
WO 2019054484 A1 3/2019
(Continued)

OTHER PUBLICATIONS

Khang et al.; "A Conductive Topological Insulator with Large Spin Hall Effect for Ultralow Power Spin-Orbit Torque Switching", Nature Materials, vol. 17, Sep. 2018; http://www.nature.com/naturematerials, (7 pages).
(Continued)

*Primary Examiner* — Kevin M Bernatz
(74) *Attorney, Agent, or Firm* — Patterson + Sheridan, LLP; Steven H. VerSteeg (57) ABSTRACT

A spin-orbit torque (SOT) magnetic tunnel junction (MTJ) device includes a substrate, a buffer layer formed over the substrate, and a bismuth antimony (BiSb) layer formed over the buffer layer, the BiSb layer having a (012) orientation. In certain embodiments, the SOT MTJ device is part of a microwave assisted magnetic recording (MAMR) write
(Continued)

head. In certain embodiments, the SOT MTJ device is part of a magnetoresistive random access memory (MRAM) device.

20 Claims, 10 Drawing Sheets

(51) Int. Cl.

| | | |
|---|---|---|
| *G11B 5/147* | (2006.01) | |
| *H10N 50/85* | (2023.01) | |
| *H10N 52/80* | (2023.01) | |
| *H10B 61/00* | (2023.01) | |
| *H10N 52/00* | (2023.01) | |
| *G11B 5/00* | (2006.01) | |

(52) U.S. Cl.
CPC ..... *H01F 10/3254* (2013.01); *H01F 10/3272* (2013.01); *H10B 61/00* (2023.02); *H10N 50/85* (2023.02); *H10N 52/00* (2023.02); *H10N 52/80* (2023.02); *G11B 2005/0024* (2013.01)

(56) References Cited

U.S. PATENT DOCUMENTS

| | | | | |
|---|---|---|---|---|
| 11,495,741 | B2* | 11/2022 | York | H03B 15/006 |
| 11,532,323 | B1* | 12/2022 | Le | H01F 10/329 |
| 2018/0366172 | A1 | 12/2018 | Wang et al. | |
| 2019/0058113 | A1 | 2/2019 | Ramaswamy et al. | |
| 2021/0408370 | A1* | 12/2021 | York | H01L 43/04 |
| 2023/0027086 | A1* | 1/2023 | Le | G11B 5/3909 |
| 2023/0047223 | A1* | 2/2023 | Le | H01F 10/3254 |

FOREIGN PATENT DOCUMENTS

| | | |
|---|---|---|
| WO | 2019125388 A1 | 6/2019 |
| WO | 2019159885 A1 | 8/2019 |

OTHER PUBLICATIONS

Roschewsky et al.: "Spin-Orbit Torque and Nernst Effect in Bi—Sb/Co Heterostructures", Physical Review, American Physical Society, B 99, 195103, May 2, 2019 (5 pages).

Chi et al.; "The Spin Hall Effect of Bi—Sb Alloys Driven by Thermally Excited Dirac-like Electrons", ArXiv: 1910.12433v1, Oct. 28, 2019 (40 pages).

Shao, Qiming, Thesis; "Spin-Orbit Torques in Topological Insulators", Master of Science in Electrical Engineering, University of California, 2015 (76 pages).

Khang, Nguyen et al; Jul. 2018, "A Colossal Breakthrough for Topological Spintronics", https://www.titech.ac.jp/english/news/2018/042001.html (4 pages).

Yao et al.; "Influence of Crystal Orientation and Surface Termination on the Growth of BiSb Thin Films on GaAs Substrates", Journal of Crystal Growth, 2019, https://doi.org/10.1016/j..crysgro.2019.01.041 (24 pages).

E.S. Walker et al,; "Composition-dependent structural transition in epitaxial Bi1—xSbx thin films on Si (111)", Phys. Rev. Materials 3, 064201, Jun. 7, 2019.

Shirokura et al.; "Origin of the Giant Spin Hall Effect in BiSb Topological Insulator", https://arxiv.org/ftp/arxiv/papers/1810/1810.10840.pdf (27 pages).

* cited by examiner

BISB TOPOLOGICAL INSULATOR WITH NOVEL BUFFER LAYER THAT PROMOTES A BISB (012) ORIENTATION

CROSS-REFERENCE TO RELATED APPLICATIONS

This application claims benefit of U.S. provisional patent application Ser. No. 62/975,661, filed Feb. 12, 2020, which is herein incorporated by reference.

BACKGROUND OF THE DISCLOSURE

Field of the Disclosure

Embodiments of the present disclosure generally relate to a buffer layer that promotes growth of a bismuth antimony (BiSb) layer having a (012) orientation.

Description of the Related Art

BiSb is a material that has been proposed as a spin Hall layer for spin torque oscillator (STO) and magnetoresistive random access memory (MRAM) devices. BiSb is a narrow gap topological insulator with both giant spin Hall effect and high electrical conductivity.

N. H. D. Khang, Y. Ueda, and P. N. Hai, "A conductive topological insulator with large spin Hall effect for ultralow power spin-orbit torque switching," Nature Materials, v. 17, 808 (2018), discovered that BiSb with a (012) crystallographic orientation has a high spin Hall angle and high conductivity in comparison to BiSb with a (001) crystallographic orientation. BiSb with a (012) crystallographic orientation was formed on a MnGa film with a (001) crystallographic orientation which was formed on a GaAs substrate with a (001) crystallographic orientation.

N. Roschewsky, E. S. Walker, P. Gowtham, S. Muschinske, F. Hellman, S. R. Bank, and S. Salahuddin, "Spin-orbit torque and Nernst effect in Bi—Sb/Co heterostructures", *Phys. Rev. B*, vol. 99, 195103 (2 May 2019), recognized that BiSb growth, crystallographic orientation, spin Hall angle, and high conductivity had poor consistency among experiments.

E. S. Walker, S. Muschinske, C. J. Brennan, S. R. Na, T. Trivedi, S. D. March, Y. Sun, T. Yang, A. Yau, D. Jung, A. F. Briggs, E. M. Krivoy, M. L. Lee, K. M. Liechti, E. T. Yu, D. Akinwande, and S. R. Bank, "Composition-dependent structural transition in epitaxial Bi1-xSbx thin films on Si (111)", *Phys. Rev. Materials* 3, 064201 (7 Jun. 2019), grew an ultrathin BiSb layer with a (012) orientation over an Si (111). However, adhesion of the BiSb layer with a (012) orientation on Si (111) was poor.

Therefore, there is a need for an improved process to form BiSb with high spin Hall angle and high conductivity and for improved devices having a BiSb layer with high spin Hall angle and high conductivity.

SUMMARY OF THE DISCLOSURE

The present disclosure generally relates to a buffer layer that promotes growth of a bismuth antimony (BiSb) layer having a (012) orientation. In one embodiment, a spin-orbit torque (SOT) magnetic tunnel junction (MTJ) device includes a substrate, a buffer layer formed over the substrate, and a bismuth antimony (BiSb) layer formed over the buffer layer, the BiSb layer having a (012) orientation. The buffer layer includes a pre-seed layer over the substrate, a seed layer over the pre-seed layer, and a crystalline layer over the seed layer. The pre-seed layer includes a material selected form a group consisting of Si, NiTa, NiFeTa, CoZrTa, NiNb, NiFeTa, NiFeW, CoHf, CoFeHf, CoFeHfB, NiFeB, CoFeB, Ge, Co, CoFe, NiCr, Ni, Cu, NiFe, Ru, Pt, Rh, silicon oxide, aluminum oxide, magnesium oxide, TiN, AlN, and alloys thereof. The seed layer includes a material selected from a group consisting of Co, CoFe, Ni, NiFe, NiCr, NiTa, NiFeTa, Cu, CuAgNi, RuX, CuX, CuNiX, CoFeX, CoNiX, FeX, NiX, and CoX, wherein X=Cr, Ag, Pt, Ir, Rh, and combinations thereof. The crystalline layer includes a material selected from a group consisting of Co, CoFe, Ni, NiFe, NiCr, NiTa, NiFeTa, Cu, CuAgNi, RuX, CuX, CuNiX, CoFeX, CoNiX, FeX, NiX, and CoX, wherein X=Cr, Ag, Pt, Ir, Rh, and combinations thereof.

In another embodiment, a microwave assisted magnetic recording (MAMR) write head includes a main pole, a trailing shield, and a spin-orbit torque (SOT) device disposed in a gap between the main pole and the trailing shield. The SOT device includes a substrate, a buffer layer formed over the substrate, a bismuth antimony (BiSb) layer over the buffer layer, and a spin torque layer formed over the BiSb layer. The BiSb layer has a (012) orientation and is a spin Hall layer.

In another embodiment, a magnetoresistive random access memory (MRAM) device includes a recording layer, a buffer layer formed over the recording layer, and a bismuth antimony (BiSb) layer formed over the buffer layer. The BiSb layer has a (012) orientation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of the present disclosure generally relate to a buffer layer that promotes growth of a bismuth antimony (BiSb) layer having a (012) orientation. The buffer layer can be grown over silicon or alumina substrates with or without an oxide layer formed thereover. A BiSb layer having a (012) orientation has a large spin Hall angle effect and high electrical conductivity. A BiSb layer having a (012) orientation can be used to form a spin-orbit torque (SOT) magnetic tunnel junction (MTJ) device. For example, a BiSb layer having a (012) orientation can be used as a spin Hall layer in a spin-orbit torque device in a microwave assisted magnetic recording (MAMR) write head. In another example, a BiSb layer having a (012) orientation can be used as a spin Hall electrode layer in a magnetoresistive random access memory (MRAM) device.

In one embodiment, a spin-orbit torque (SOT) magnetic tunnel junction (MTJ) device includes a substrate, a buffer layer formed over the substrate, and a bismuth antimony (BiSb) layer formed over the buffer layer, the BiSb layer having a (012) orientation. The buffer layer includes a pre-seed layer over the substrate, a seed layer over the pre-seed layer, and a crystalline layer over the seed layer. The pre-seed layer includes a material selected form a group consisting of Si, NiTa, NiFeTa, CoZrTa, NiNb, NiFeTa, NiFeW, CoHf, CoFeHf, CoFeHfB, NiFeB, CoFeB, Ge, Co, CoFe, NiCr, Ni, Cu, NiFe, Ru, Pt, Rh, silicon oxide, aluminum oxide, magnesium oxide, TiN, AlN, and alloys thereof. The seed layer includes a material selected from a group consisting of Co, CoFe, Ni, NiFe, NiCr, NiTa, NiFeTa, Cu, CuAgNi, RuX, CuX, CuNiX, CoFeX, CoNiX, FeX, NiX, and CoX, wherein X=Cr, Ag, Pt, Ir, Rh, and combinations thereof. The crystalline layer includes a material selected from a group consisting of Co, CoFe, Ni, NiFe, NiCr, NiTa, NiFeTa, Cu, CuAgNi, RuX, CuX, CuNiX, CoFeX, CoNiX, FeX, NiX, and CoX, wherein X=Cr, Ag, Pt, Ir, Rh, and combinations thereof.

Figure 1:
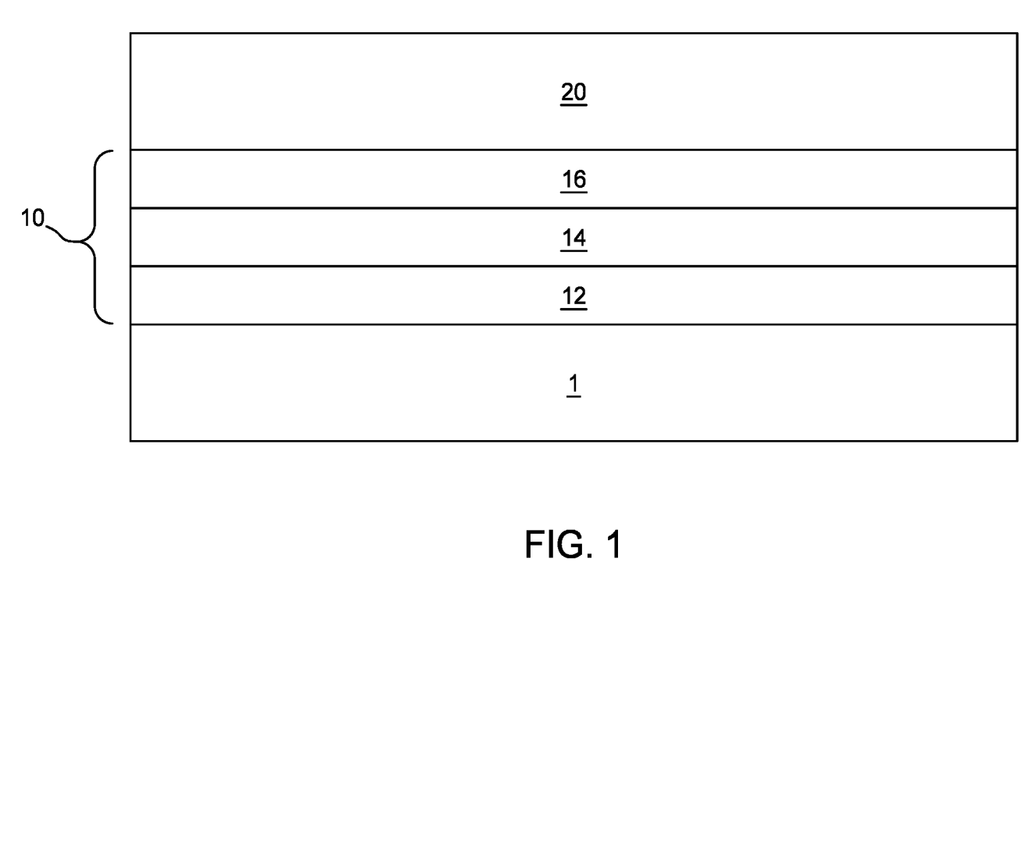
FIG. 1 is a schematic cross-sectional view of certain embodiments of a BiSb layer with a (012) orientation formed over a buffer layer formed over a substrate.

FIG. 1 is a schematic cross-sectional view of certain embodiments of a BiSb layer 20 with a crystal orientation of (012) formed over a buffer layer 10 formed over a substrate 1. The substrate 1 can be a silicon substrate or an alumina substrate. The silicon substrate has a cubic structure of (111), (100), (100), or other crystal orientations. The alumina substrate has a hexagonal structure with (001) orientations or with other crystal orientations or has an amorphous structure. The substrate 1 can be a bare substrate or can have one or more layers formed thereover, such as an oxide layer thermally grown or deposited thereover.

The buffer layer 10 comprises a pre-seed layer 12 formed over the substrate 1, a seed layer 14 formed on the pre-seed layer 12, and a crystalline layer 16 formed on the seed layer 14.

The pre-seed layer 12 provides adhesion to the substrate 1. The pre-seed layer comprises an amorphous material or a crystalline material. Examples of amorphous materials include Si, NiTa, NiFeTa, CoZrTa, NiNb, NiFeTa, NiFeW, CoHf, CoFeHf, CoFeHfB, NiFeB, CoFeB, Ge, and alloys thereof. In certain embodiments, the pre-seed layer 12 comprises an amorphous material of Si, NiTa, NiFeTa, and alloys thereof. Examples of crystalline materials include Co, CoFe, NiCr, Ni, Cu, NiFe, Ru, Pt, Rh, silicon oxide, aluminum oxide, magnesium oxide, TiN, AlN, and alloys thereof. In certain embodiments, the pre-seed layer 12 comprises a crystalline material of NiCr, Cu, NiFe, Co, and CoFe and alloys thereof.

The seed layer 14 provides an interface between the pre-seed layer 12 and the crystalline layer 16 and helps to provide growth of the crystalline layer 16 with low crystal defects. The seed layer 14 can be a crystalline material of a face-centered cubic (fcc) material or a hexagonal close packed (hcp) material. Examples of a seed layer 14 include Co, CoFe, Ni, NiFe, NiCr, NiTa, NiFeTa, Cu, CuAgNi, metal alloys, and combinations thereof. Examples of metal alloys of the seed layer 14 include RuX, CuX, CuNiX, CoFeX, CoNiX, FeX, NiX, CoX, where X=Cr, Ag, Pt, Ir, Rh, Al, Mn, and combinations thereof. In certain embodiments, the seed layer 14 comprises Co, CoFe, Ni, NiFe, Cu, CuNiAg, and alloys thereof.

The crystalline layer 16 helps to provide growth of the BiSb layer 20 with a (012) orientation. The crystalline layer 16 can be a crystalline material of a fcc material or a hcp material. Examples of a crystalline layer 16 include Co, CoFe, Ni, NiFe, NiCr, NiTa, NiFeTa, Cu, CuAgNi, metal alloys, and combinations thereof. Examples of metal alloys of the crystalline layer 16 include RuX, CuX, CuNiX, CoFeX, CoNiX, FeX, NiX, CoX, where X=Cr, Ag, Pt, Ir, Rh, Al, Mn, and combinations thereof. In certain embodiments, the crystalline layer 16 comprises Co, CoFe, Ni, NiFe, Cu, CuNiAg, and alloys thereof.

The seed layer 14 and the crystalline layer 16 can comprise the same or different materials. The seed layer 14 and the crystalline layer 16 can have similar properties. In certain embodiments, the seed layer 14 and the crystalline layer 16 provide a lattice structure gradient from larger to smaller or from smaller to larger to enhance lattice matching of the crystalline layer 16 and the BiSb layer 20.

In certain embodiments, the seed layer 14 and the crystalline layer 16 comprise one or more fcc materials with a (111) orientation with an a-axis from about 3.52 Å to about 3.71 Å, which has been discovered by the present inventors as surprisingly providing growth of a BiSb layer with a (012) orientation. For example, the fcc material with a (111) orientation may be a Cu or a CuAg alloy with an atomic percent content of silver from greater than zero to about 18%. The Cu or CuAg alloy has an a-axis from about 3.60 Å to about 3.71 Å.

In certain embodiments, the seed layer 14 and the crystalline layer 16 comprise one or more hcp materials with a (002) orientation with an a-axis from about 2.49 Å to about 2.62 Å, which has been discovered by the present inventors as surprisingly providing growth of a BiSb layer with a (012) orientation.

In certain embodiments, the buffer layer 10 is deposited by physical vapor deposition (PVD), such as sputtering, molecular beam epitaxy, ion beam deposition, other suitable PVD processes, and combinations thereof. In certain embodiments, the buffer layer 10 is deposited at ambient temperatures, such as from 20° C. to about 25° C. In one aspect, forming the buffer layer 10 at ambient temperatures reduces thermal migration of the pre-seed layer 12, the seed layer 14, and the crystalline layer 16. In another aspect, forming the buffer layer 10 at ambient temperatures minimizes altering the magnetization direction of magnetic materials formed on substrate 1 prior to forming the buffer layer 10. In certain embodiments, the pre-seed layer 12 is formed to a thickness from about 2 Å to about 50 Å, such as from about 5 Å to about 30 Å. In certain embodiments, the seed layer 14 is formed to a thickness from about 2 Å to about 20 Å, such as from about 3 Å to about 12 Å. In certain embodiments, the crystalline layer 16 is formed to a thickness from about 1 Å to about 15 Å, such as from about 2 Å to about 7 Å. A thickness of the crystalline layer 16 from about 1 Å to about 15 Å helps to maintain electrical current flow from the buffer layer 10 through the BiSb layer 20 in SOT devices. A crystalline layer 16 with a thickness of over 15 Å may cause current shunting of the electrical current flow through the buffer layer 10 away from the BiSb layer 20 in SOT devices.

In certain embodiments, a post etch of the buffer layer 10 is conducted. For example, the buffer layer 10 can be post etched by an ion etch, such as directing argon ions to etch the crystalline layer 16. It is believed that a post etch enhances the interface between the crystalline layer 16 and the BiSb layer 20 by cleaning the surface of the crystalline layer 16 and/or by distorting the crystalline layer 16 to promote (012) growth thereover.

The BiSb layer 20 has a (012) orientation. The BiSb layer 20 comprises $Bi_{1-x}Sb_x$ wherein x is 0<x<1. In certain embodiments, the BiSb layer 20 comprises $Bi_{1-x}Sb_x$ wherein x is 0.05<x<0.2 or comprises antimony in an atomic percent content from about 7% to about 22%. In certain embodiments, the BiSb layer 20 is formed to a thickness from about 20 Å to about 200 Å, such as from about 50 Å to about 150 Å.

TABLE 1 shows one example of the properties of a BiSb layer with a (012) orientation in comparison to beta-tantalum and a BiSb layer with a (001) orientation.

TABLE 1

|  | Spin Hall angle $\theta_{SH}$ | conductivity $\sigma$ ($10^6$ $\Omega^{-1}m^{-1}$) | Power (relative) |
| --- | --- | --- | --- |
| Beta-Ta | −0.15 | 0.52 | 1 |
| BiSb (001) | 11 | 0.25 | $3.9 \times 10^{-04}$ |
| BiSb (012) | 52 | 0.25 | $1.7 \times 10^{-05}$ |

A BiSb layer with a (012) orientation has similar electrical conductivity and a much larger spin Hall angle than beta-tantalum (Beta-Ta) or a BiSb layer with a (001) orientation. Therefore, the relative power to produce a spin Hall effect is lower for BiSb (012) in comparison to Beta-Ta or BiSb (001).

Figure 2:
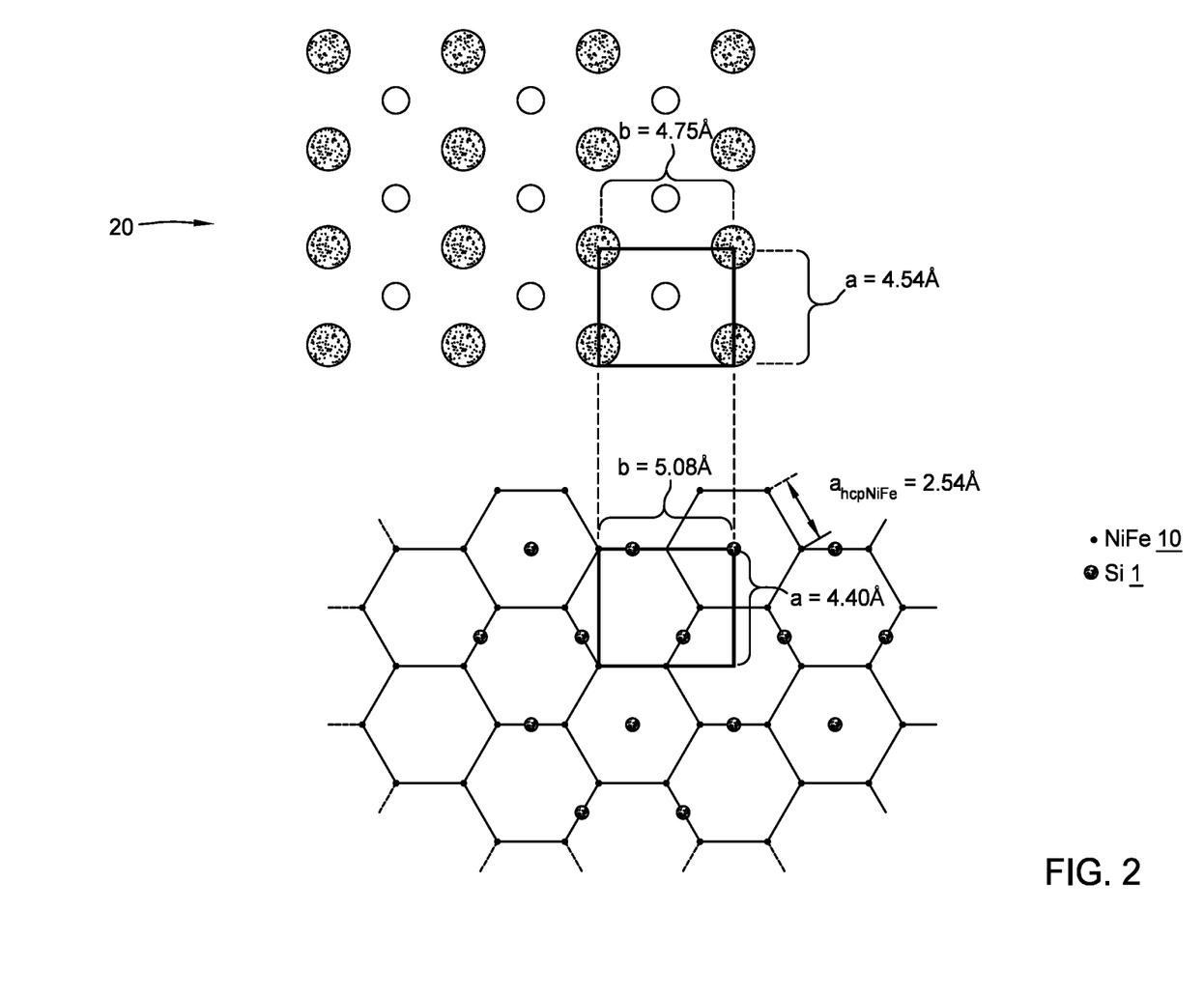
FIG. 2 is a schematic plan view illustrating certain embodiments of a BiSb layer with a (012) orientation formed over a buffer layer with a (111) fcc orientation or with a (002) hcp orientation.

FIG. 2 is a schematic plan view illustrating certain embodiments of a BiSb layer 20 with a (012) orientation formed over a buffer layer 10 with a (111) fcc orientation or with a (002) hcp orientation. The different symbols of each layer represent an atom of the material at a different depth in the layer.

In certain embodiments a BiSb layer 20 with a (012) orientation forms over a buffer layer 10 with a (111) fcc orientation or with a (002) hcp orientation due to an a-axis lattice parameter of the buffer layer that is in about 2:3 ratio with the a-axis of silicon of a Si (111) surface. For example, as shown in FIG. 2, a buffer layer 10 comprising $Ni_xFe_{1-x}$ (111) with x of about 0.5 has an a-axis lattice parameter which is in about 2:3 ratio with the a-axis of silicon of a Si (111) surface. The NiFe (111) surface can line up with the Si (111) surface. The rectangular outline drawn in the bottom part of FIG. 2 of a NiFe (111) surface with dimensions a=about 4.40 Å and b=about 5.08 Å shows that NiFe (111) surface lines up with the approximate rectangular BiSb (012) surface (shown at the top part of FIG. 2) with dimensions of a=about 4.54 Å and of b=about 4.75 Å with about 3% mismatch in one direction. Therefore, a (111) textured NiFe thin film can be used as a buffer layer 10 to grow (012) textured BiSb layer 20. It is understood that the transformation of $a_{fcc}$ to $a_{hcp}$ is $a_{fcc}/\sqrt{2} \rightarrow a_{hcp}$ so $a_{hcp}$ axis also has the 2:3 ratio.

Figure 7:
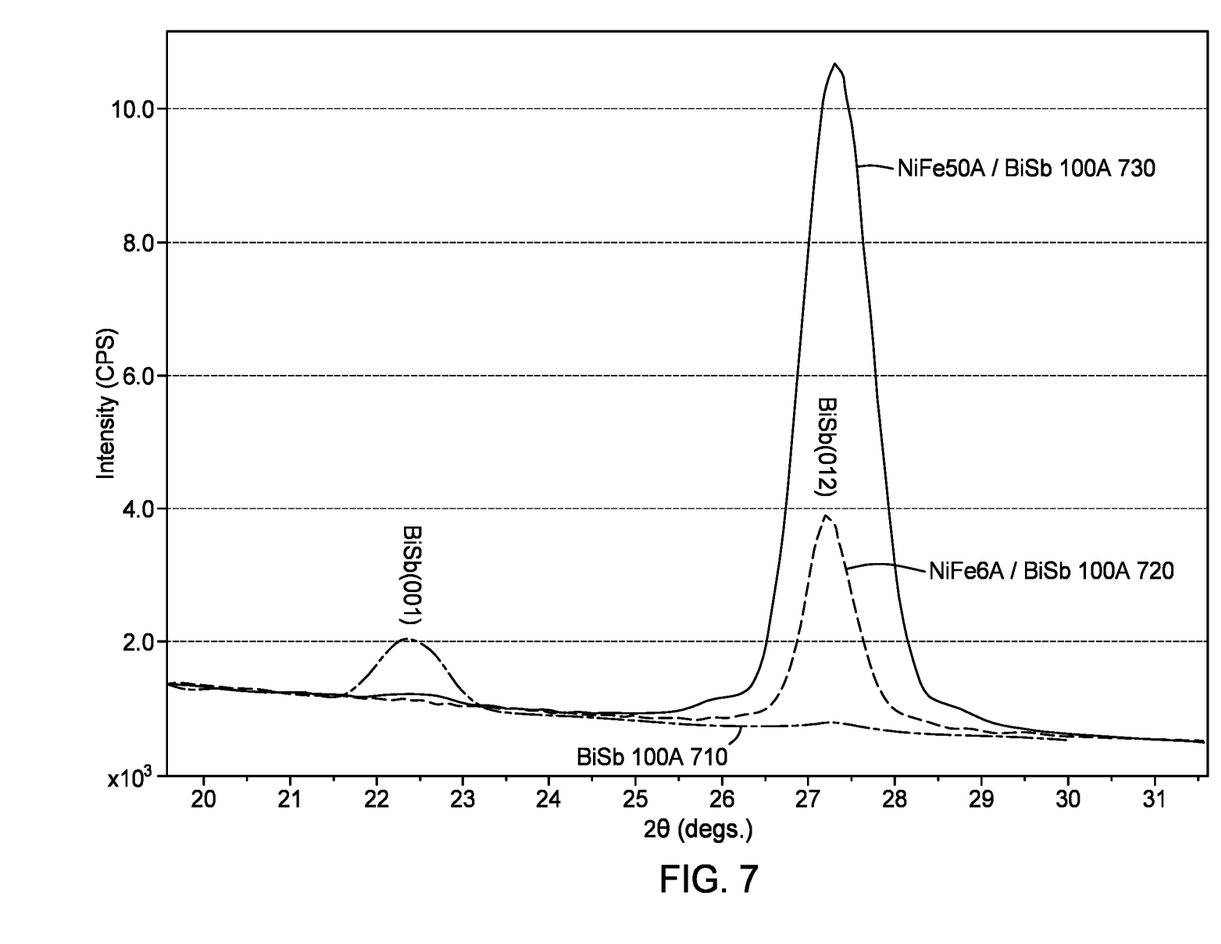
FIGS. 7-9 illustrate X-ray diffraction (XRD) 2e scans of BiSb layers formed on various material layers.

In the examples as discussed in reference to FIG. 7, a highly textured BiSb (012) surface was grown on a highly (111) textured NiFe layer. The amorphous Si enhances (111) NiFe growth thereover. The examples demonstrated that BiSb (012) texture can be formed from polycrystalline epitaxy using a (111) textured fcc lattice matching thin film, such as a (111) NiFe layer, or a (002) textured hcp lattice matching thin film, such as a (002) Co layer. These textured films help to manufacture BiSb (012) texture at a production scale. It is believed that a BiSb (012) epitaxial film can be grown through crystalline epitaxy over a single crystal Si (111) surface. For example, it is believed that a NiFe (111) buffer layer can be epitaxially grown over a single crystal Si (111) and a BiSb (012) layer can be epitaxially grown on the NiFe (111) buffer layer to form an epitaxial film stack of Si (111)/NiFe (111)/BiSb (012).

In certain embodiments, the fcc material with a (111) orientation as shown in FIG. 2, a hcp material with a (002) orientation, and combinations thereof can approximately line up with a BiSb layer 20 with a (012) orientation. The (111) orientation of the fcc material or the (002) orientation of the hcp material promotes BiSb growth with a (012) orientation instead of a growth with a (001) orientation. A BiSb layer 20 with a (012) orientation has a higher spin Hall angle and higher performance in a SOT MTJ device than a BiSb layer with a (001) orientation. The SOT MTJ device can be in a perpendicular stack configuration or an in-plane stack configuration. The SOT MTJ device can be utilized in, for example, MAMR writing heads, in MRAM, in artificial intelligence chips, and in other applications.

Figure 3:
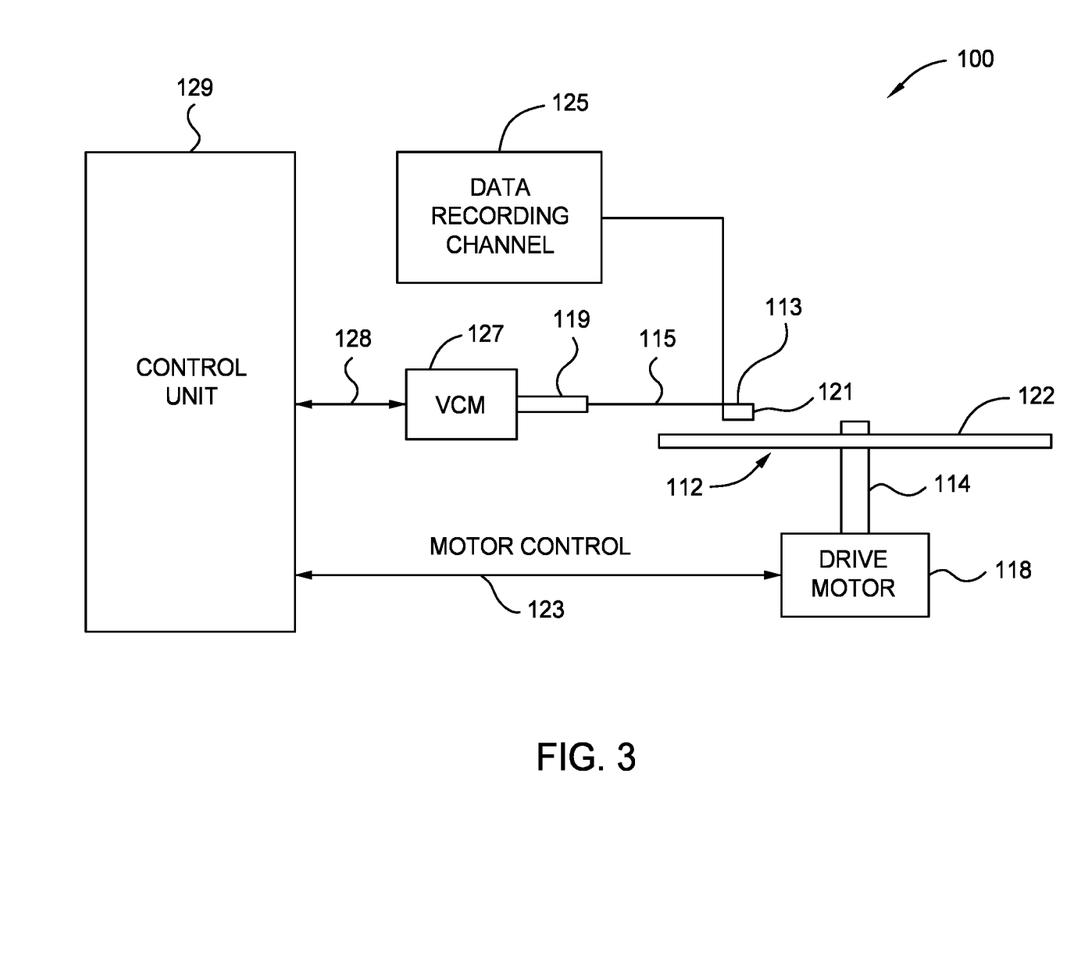
FIG. 3 is a schematic illustration of certain embodiments of a magnetic media drive including a MAMR write head.

FIG. 3 is a schematic illustration of certain embodiments of a magnetic media drive including a MAMR write head having a SOT MTJ device. Such a magnetic media drive may be a single drive or comprise multiple drives. For the sake of illustration, a single disk drive 100 is shown according to certain embodiments. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

At least one slider 113 is positioned near the magnetic disk 112, each slider 113 supporting one or more magnetic head assemblies 121 that include a SOT device. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 2 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic media drive and the accompanying illustration of FIG. 3 are for representation purposes only. It should be apparent that magnetic media drives may contain a large number of media, or disks, and actuators, and each actuator may support a number of sliders.

Figure 4:
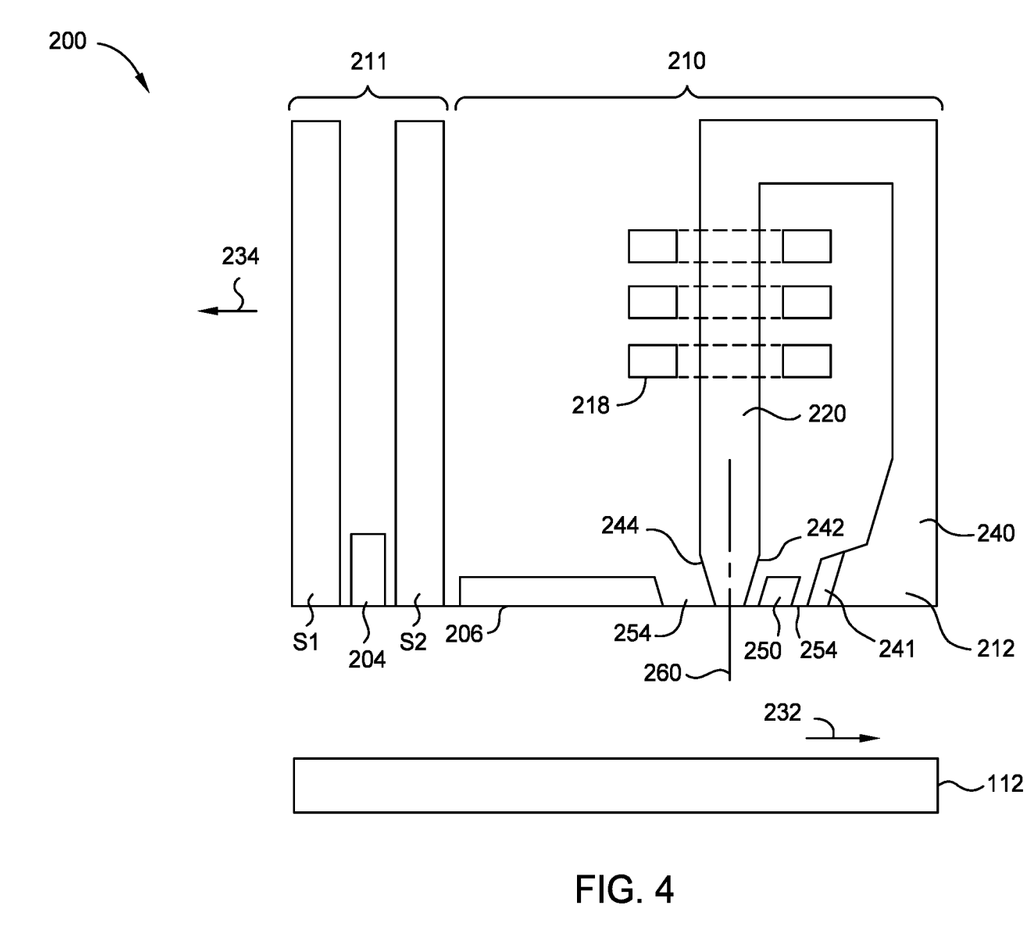
FIG. 4 is a fragmented, cross-sectional side view of a read/write head facing a magnetic medium according to certain embodiments.

FIG. 4 is a fragmented, cross-sectional side view of certain embodiments of a read/write head 200 having a SOT MTJ device. The read/write head 200 faces a magnetic media 112. The read/write head 200 may correspond to the magnetic head assembly 121 described in FIG. 3. The read/write head 200 includes a media facing surface (MFS) 212, such as a gas bearing surface, facing the disk 112, a MAMR write head 210, and a magnetic read head 211. As shown in FIG. 4, the magnetic media 112 moves past the MAMR write head 210 in the direction indicated by the arrow 232 and the read/write head 200 moves in the direction indicated by the arrow 234.

In some embodiments, the magnetic read head 211 is a magnetoresistive (MR) read head that includes an MR sensing element 204 located between MR shields S1 and S2. In other embodiments, the magnetic read head 211 is a magnetic tunnel junction (MTJ) read head that includes a MTJ sensing device 204 located between MR shields S1 and S2. The magnetic fields of the adjacent magnetized regions in the magnetic disk 112 are detectable by the MR (or MTJ) sensing element 204 as the recorded bits.

The MAMR write head 210 includes a main pole 220, a leading shield 206, a trailing shield 240, a spin orbital torque (SOT) device 250, and a coil 218 that excites the main pole 220. The coil 218 may have a "pancake" structure which winds around a back-contact between the main pole 220 and the trailing shield 240, instead of a "helical" structure shown in FIG. 4. The SOT device 250 is formed in a gap 254 between the main pole 220 and the trailing shield 240. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220. In some embodiments, the main pole 220 does not include the trailing taper 242 and the leading taper 244. Instead, the main pole 220 includes a trailing side (not shown) and a leading side (not shown), and the trailing side and the leading side are substantially parallel. The main pole 220 may be a magnetic material, such as a FeCo alloy. The leading shield 206 and the trailing shield 240 may be a magnetic material, such as a NiFe alloy. In certain embodiments, the trailing shield 240 can include a trailing shield hot seed layer 241. The trailing shield hot seed layer 241 can include a high moment sputter material, such as CoFeN or FeXN, where X includes at least one of Rh, Al, Ta, Zr, and Ti. In certain embodiments, the trailing shield 240 does not include a trailing shield hot seed layer.

Figure 5A:
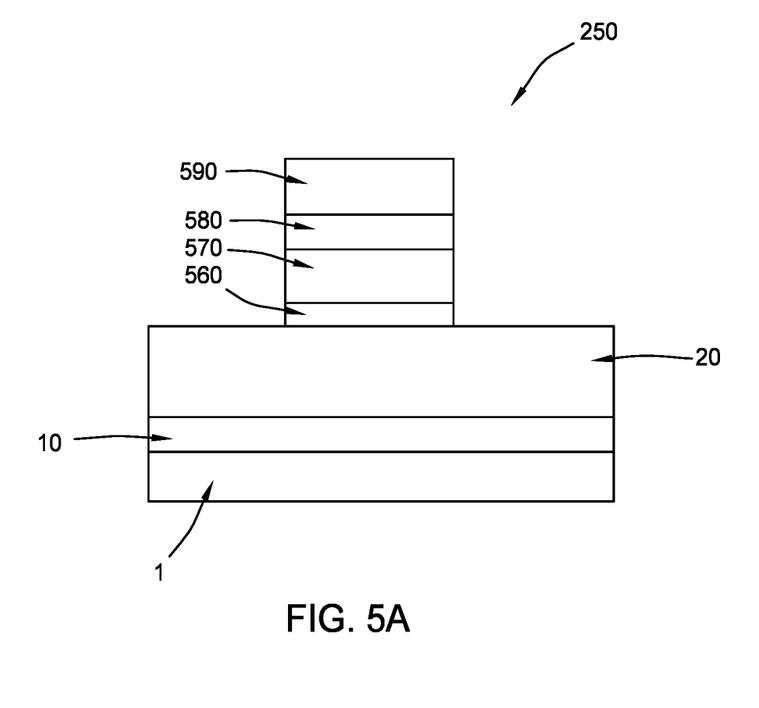
FIG. 5A is a schematic cross-sectional view of a SOT device for use in a MAMR write head.

FIG. 5A is a schematic cross-sectional view of a SOT device 250 for use in a MAMR write head, such as the MAMR write head of the drive 100 of FIG. 3 or other suitable magnetic media drives. The SOT device 250 comprises a BiSb layer 20 with a (012) orientation formed over a buffer layer 10 formed over a substrate 1. A spin torque layer (STL) 570 is formed over the BiSb layer 20. The STL 570 comprises a ferromagnetic material such as one or more layers of CoFe, Colr, NiFe, and CoFeX alloy wherein X=B, Ta, Re, or Ir.

In certain embodiments, an electrical current shunt block layer 560 is disposed between the BiSb layer 20 and the spin torque layer 570. The electrical current shunt blocking layer 560 reduces electrical current from flowing from the BiSb layer 20 to the spin torque layer 570 but allows spin orbital coupling of the BiSb layer 20 and the spin torque layer 570. In certain embodiments, the electrical current shunt blocking layer 560 comprises a magnetic material which provides greater spin orbital coupling between the BiSb layer 20 and the spin torque layer 570 than a non-magnetic material. In certain embodiments, the electrical current shunt blocking layer 560 comprises a magnetic material of FeCo, FeCoM, FeCoMO, FeCoMMeO, FeCoM/MeO stack, FeCoMN-iMnMgZnFeO, FeCoM/NiMnMgZnFeO stack, multiple layers/stacks thereof, and combinations thereof in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr. In certain embodiments, the electrical current shunt blocking layer 560 is formed to a thickness from about 10 Å to about 100 Å. In certain aspects, an electrical current shunt blocking layer 560 having a thickness of over 100 Å may reduce spin orbital coupling of the BiSb layer 20 and the spin torque layer 570. In certain aspects, an electrical current shunt blocking layer having a thickness of less than 10 Å may not sufficiently reduce electrical current from BiSb layer 20 to the spin torque layer 570.

In certain embodiments, additional layers are formed over the STL 570 such as a spacer layer 580 and a pinning layer 590. The pinning layer 590 can partially pin the STL 570. The pinning layer 590 comprises a single or multiple layers of PtMn, NiMn, IrMn, IrMnCr, CrMnPt, FeMn, other antiferromagnetic materials, and combinations thereof. The spacer layer 580 comprises single or multiple layers of magnesium oxide, aluminum oxide, other non-magnetic materials, and combinations thereof.

Figure 5B:
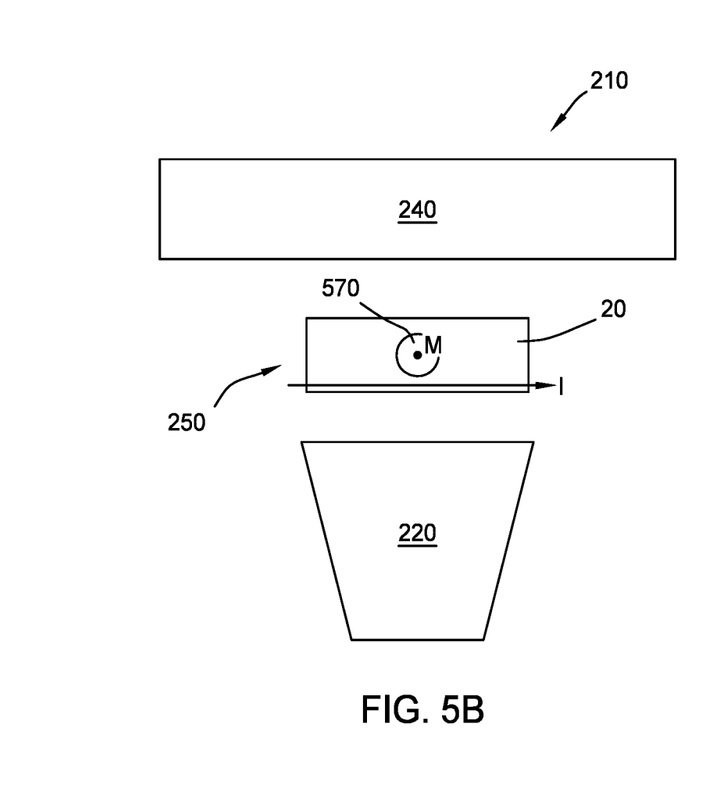
FIGS. 5B-5C are schematic MFS views of certain embodiments of a portion of a MAMR write head with a SOT device of FIG. 5A.
Figure 5C:
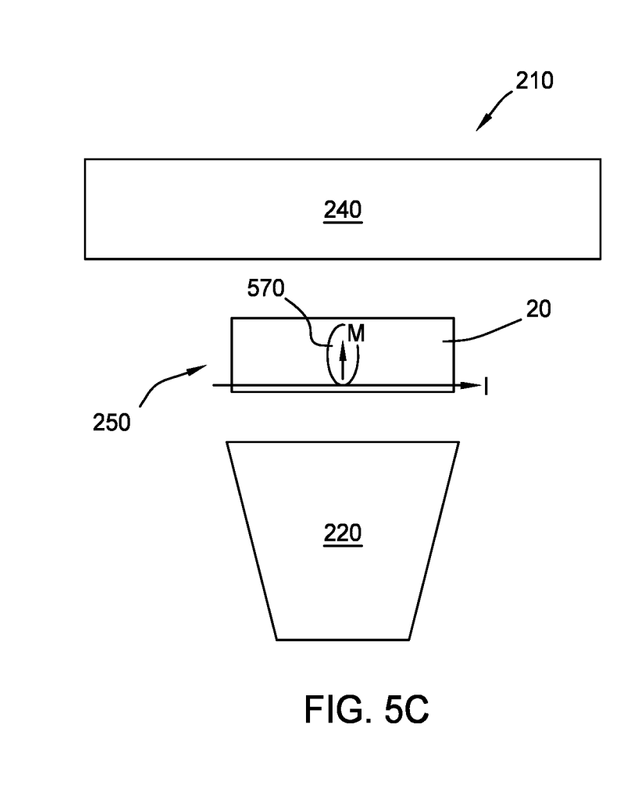

FIGS. 5B-5C are schematic MFS views of certain embodiments of a portion of a MAMR write head 210 with a SOT device 250 of FIG. 5A. The MAMR write head 210 can be the write head FIG. 4 or other suitable write heads in the drive 100 of FIG. 3 or other suitable magnetic media drives such as tape drives. The MAMR write head 210 includes a main pole 220 and a trailing shield 240 in a track direction. The SOT device 250 is disposed in a gap between the main pole and the trailing shield 240.

During operation, charge current through a BiSb layer 20 acting as a spin Hall layer generates a spin current in the BiSb layer. The spin orbital coupling of the BiSb layer and a spin torque layer (STL) 570 causes switching or precession of magnetization of the STL 570 by the spin orbital coupling of the spin current from the BiSb layer 20. Switching or precession of the magnetization of the STL 570 can generate an assisting AC field to the write field. Energy assisted write heads based on SOT have multiple times greater power efficiency in comparison to MAMR write heads based on spin transfer torque. As shown in FIG. 5B, an easy axis of a magnetization direction of the STL 570 is perpendicular to the MFS from shape anisotropy of the STL 570, from the pinning layer 590 of FIG. 5A, and/or from hard bias elements proximate the STL 570. As shown in FIG. 5C, an easy axis of a magnetization direction of the STL 570 is parallel to the MFS from shape anisotropy of the STL 570, from the pinning layer 590 of FIG. 5A, and/or from hard bias elements proximate the STL 570.

Figure 6:
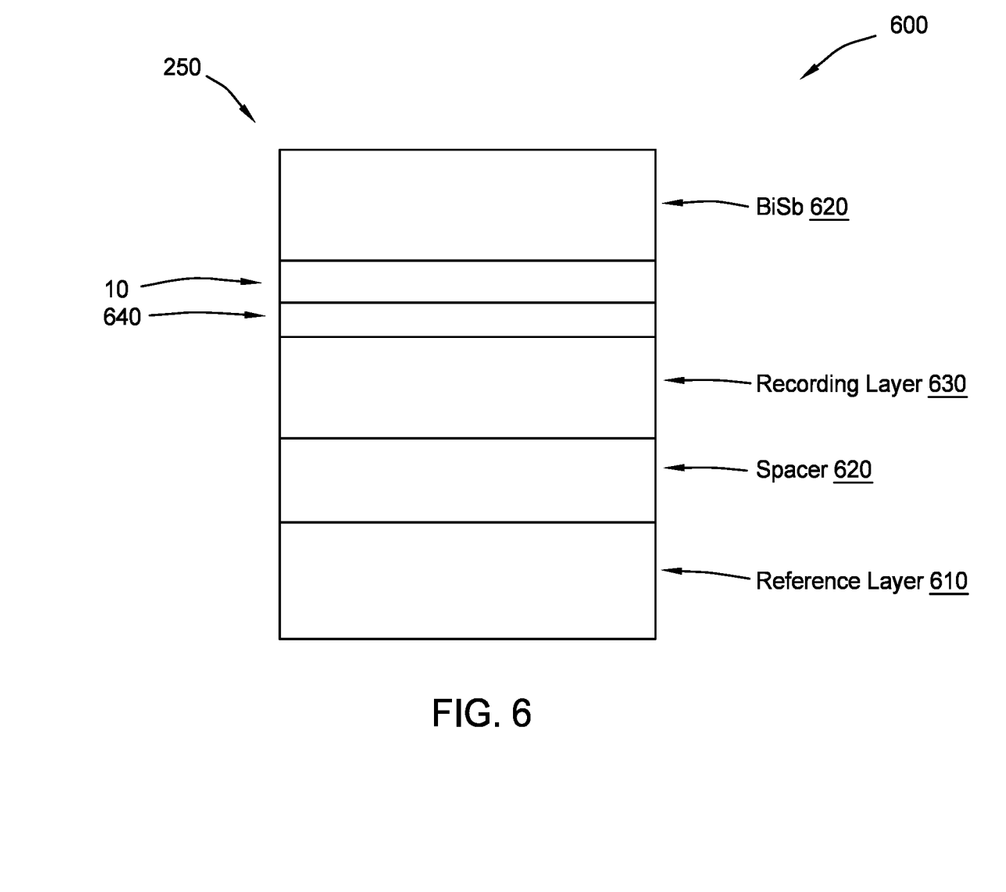
FIG. 6 is a schematic cross-sectional view of a SOT MTJ used as a MRAM device.

FIG. 6 is a schematic cross-sectional view of a SOT MTJ 250 used as a MRAM device 600. The MRAM device comprises a reference layer (RL) 610, a spacer layer 620 over the RL 610, a recording layer 630 over the spacer layer 620, a buffer layer 10 over the recording layer 630, and a BiSb layer 20 over the buffer layer 10.

The RL 610 comprises single or multiple layers of CoFe, other ferromagnetic materials, and combinations thereof. The spacer layer 620 comprises single or multiple layers of magnesium oxide, aluminum oxide, other dielectric materials, and combinations thereof. The recording layer 630 comprises single or multiple layers of CoFe, NiFe, other ferromagnetic materials, and combinations thereof.

In certain embodiments, an electrical current shunt block layer 640 is disposed between the buffer layer 10 and the recording layer 630. The electrical current shunt blocking layer 640 reduces electrical current from flowing from the BiSb layer 20 to the recording layer 630 but allows spin orbital coupling of the BiSb layer 20 and the recording layer 630. For example, writing to the MRAM device can be enabled by the spin orbital coupling of the BiSb layer and the recording layer 630, which enables switching of magnetization of the recording layer 630 by the spin orbital coupling of the spin current from the BiSb layer 20. In certain embodiments, the electrical current shunt blocking layer 640 comprises a magnetic material which provides greater spin orbital coupling between the BiSb layer 20 and the recording layer 630 than a non-magnetic material. In certain embodiments, the electrical current shunt blocking layer 640 comprises a magnetic material of FeCoM, FeCoMO, FeCoMMeO, FeCoM/MeO stack, FeCoMNiMnMgZnFeO, FeCoM/NiMnMgZnFeO stack, multiple layers/stacks thereof, and combinations thereof, in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr.

The MRAM device 600 of FIG. 6 may include other layers, such as pinning layers, pinning structures (e.g., a synthetic antiferromagnetic (SAF) pinned structure), electrodes, gates, and other structures. Other MRAM devices besides the structure of FIG. 6 can be formed utilizing a BiSb layer with a (012) orientation over a buffer layer 10 to form a SOT MTJ.

Embodiments of the present disclosure generally relate to a buffer layer that promotes growth of a bismuth antimony (BiSb) layer having a (012) orientation. The buffer layer comprises one or more layers and can be grown over silicon or alumina substrates with or without an oxide layer formed thereover. A BiSb layer having a (012) orientation has a large spin Hall angle effect and high electrical conductivity. A BiSb layer having a (012) orientation can be used to form a spin-orbit torque (SOT) magnetic tunnel junction (MTJ) device.

In one embodiment, a spin-orbit torque (SOT) magnetic tunnel junction (MTJ) device includes a substrate, a buffer layer formed over the substrate, and a bismuth antimony (BiSb) layer formed over the buffer layer, the BiSb layer having a (012) orientation. The buffer layer includes a pre-seed layer over the substrate, a seed layer over the pre-seed layer, and a crystalline layer over the seed layer. The pre-seed layer includes a material selected form a group consisting of Si, NiTa, NiFeTa, CoZrTa, NiNb, NiFeTa, NiFeW, CoHf, CoFeHf, CoFeHfB, NiFeB, CoFeB, Ge, Co, CoFe, NiCr, Ni, Cu, NiFe, Ru, Pt, Rh, silicon oxide, aluminum oxide, magnesium oxide, TiN, AlN, and alloys thereof. The seed layer includes a material selected from a group consisting of Co, CoFe, Ni, NiFe, NiCr, NiTa, NiFeTa, Cu, CuAgNi, RuX, CuX, CuNiX, CoFeX, CoNiX, FeX, NiX, and CoX, wherein X=Cr, Ag, Pt, Ir, Rh, and combinations thereof. The crystalline layer includes a material selected from a group consisting of Co, CoFe, Ni, NiFe, NiCr, NiTa, NiFeTa, Cu, CuAgNi, RuX, CuX, CuNiX, CoFeX, CoNiX, FeX, NiX, and CoX, wherein X=Cr, Ag, Pt, Ir, Rh, and combinations thereof.

In another embodiment, a microwave assisted magnetic recording (MAMR) write head includes a main pole, a trailing shield, and a spin-orbit torque (SOT) device disposed in a gap between the main pole and the trailing shield. The SOT device includes a substrate, a buffer layer formed over the substrate, a bismuth antimony (BiSb) layer over the buffer layer, and a spin torque layer formed over the BiSb layer. The BiSb layer has a (012) orientation and is a spin Hall layer.

In another embodiment, a magnetoresistive random access memory (MRAM) device includes a recording layer, a buffer layer formed over the recording layer, and a bismuth antimony (BiSb) layer formed over the buffer layer. The BiSb layer has a (012) orientation.

EXAMPLES

The following are examples to illustrate various embodiments of a BiSb layer, such as the BiSb layer 20 of FIGS. 1 and 2, the magnetic drive 100 of FIG. 3, the write head 210 of FIG. 4, the SOT devices 250 of FIGS. 5A-C and 6, other BiSb layers, other magnetic drives, other SOT devices, and variations thereof. These examples are not meant to limit the scope of the claims unless specifically recited in the claims.

Example A

In Example A (FIG. 7), a BiSb layer 710 was deposited by PVD to a thickness of about 100 Å directly on a silicon (111)

substrate. A BiSb layer 720 was deposited by PVD to a thickness of about 100 Å directly on a NiFe layer. The NiFe layer was deposited by PVD to a thickness of about 6 Å over a silicon (111) substrate. A BiSb layer 730 was deposited by PVD to a thickness of about 100 Å directly on a NiFe layer. The NiFe layer was deposited by PVD to a thickness of about 50 Å over a silicon (111) substrate.

FIG. 7 illustrates X-ray diffraction (XRD) 2Θ scans of the BiSb layers 710, 720, 730. The BiSb layer 710 directly formed on a thermal oxide coated silicon substrate showed a (001) orientation. The BiSb layers 720, 730 directly formed on NiFe layers over a thermal oxide coated silicon substrates showed a (012) orientation.

Example B

In Example B (FIG. 8), a BiSb layer 1010 was deposited by PVD to a thickness of about 100 Å directly on a Cu layer. The Cu layer was deposited by PVD to a thickness of about 20 Å over a thermal oxide coated silicon substrate. A BiSb layer 1020 was deposited by PVD to a thickness of about 100 Å directly on a NiFe layer. The NiFe layer was deposited by PVD to a thickness of about 10 Å over a thermal oxide coated silicon substrate. A BiSb layer 1030 was deposited by PVD to a thickness of about 100 Å directly on a NiTa layer. The NiTa layer was deposited by PVD to a thickness of about 20 Å over a thermal oxide coated silicon substrate. A BiSb layer 1040 was deposited by PVD to a thickness of about 100 Å directly on a NiFe layer. The NiFe layer was deposited to a thickness of about 5 Å by PVD directly on a Cu layer. The Cu layer was deposited by PVD to a thickness of about 20 Å over a thermal oxide coated silicon substrate. A BiSb layer 1050 was deposited by PVD to a thickness of about 100 Å directly on a Cu layer. The Cu layer was deposited by PVD to a thickness of 20 Å directly on a Ta layer. The Ta layer was deposited by PVD to a thickness of about 20 Å over a thermal oxide coated silicon substrate.

Figure 8:
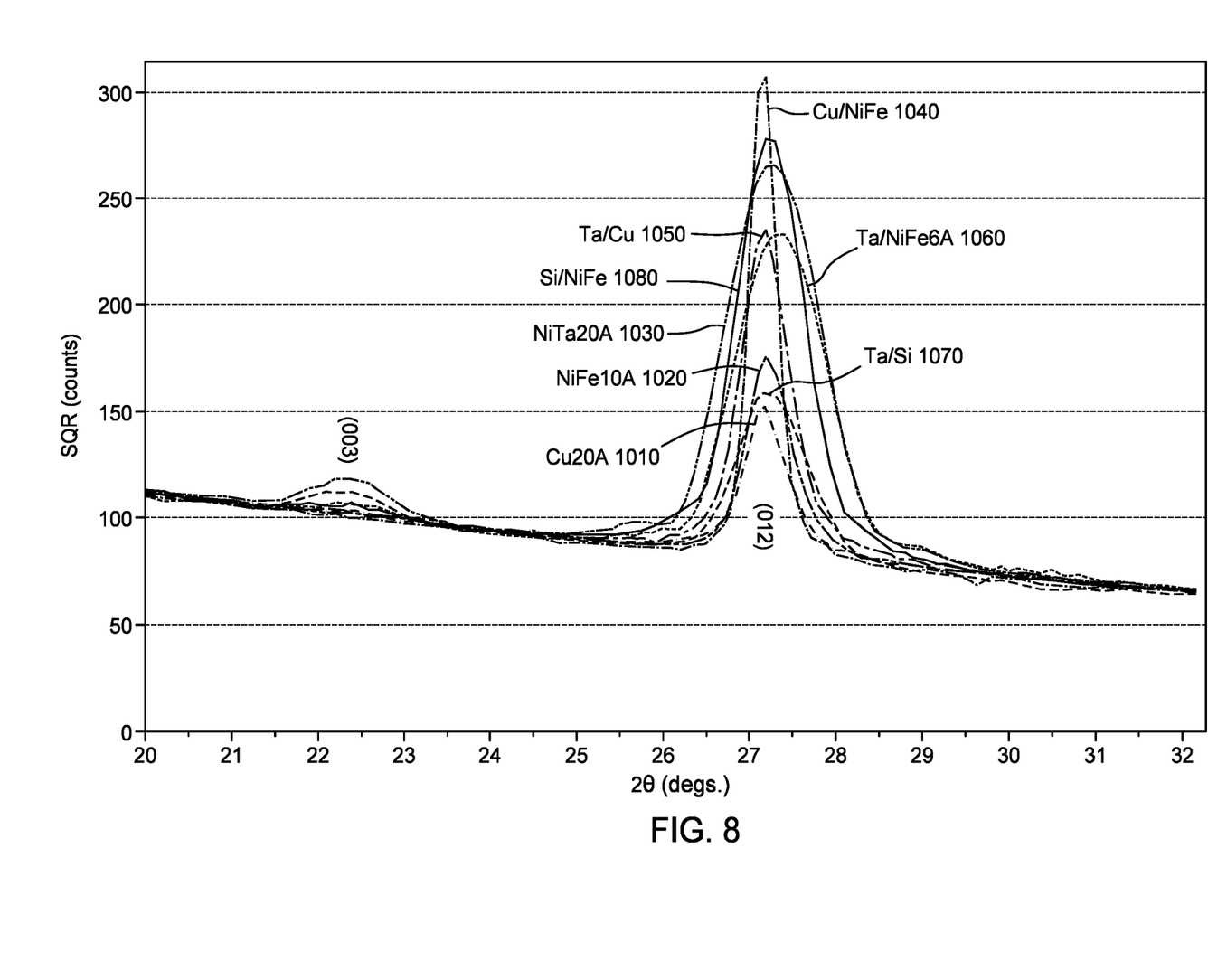

A BiSb layer 1060 was deposited by PVD to a thickness of about 100 Å directly on a NiFe layer. The NiFe layer was deposited by PVD to a thickness of about 6 Å directly on a Ta layer. The Ta layer was deposited by PVD to a thickness of 20 Å over a thermal oxide coated silicon substrate. A BiSb layer 1070 was deposited by PVD to a thickness of about 100 Å directly on a Si layer. The amorphous Si layer was deposited by PVD directly on a Ta layer. The Ta layer was deposited by PVD over a thermal oxide coated silicon substrate. A BiSb layer 1080 was deposited by PVD to a thickness of about 100 Å directly on a NiFe layer. The NiFe layer was deposited by PVD directly on a Si layer. The Si layer was deposited by PVD over a thermal oxide coated silicon substrate.

FIG. 8 illustrates XRD 2e scans of the BiSb layers 1010, 1020, 1030, 1040, 1050, 1060, 1070, 1080. The BiSb layers 1010, 1020, 1030, 1040, 1050, 1060, 1070, 1080 showed a (012) orientation Example C In Example C (FIG. 9), a BiSb layer 1110 was deposited by PVD to a thickness of about 100 Å directly on a NiTa layer having a thickness of about 20 Å over a thermal oxide coated silicon substrate. A BiSb layer 1120 was deposited by PVD to a thickness of about 100 Å directly on a NiFe layer. The NiFe layer was deposited by PVD to a thickness of about 6 Å over a thermal oxide coated silicon substrate. A BiSb layer 1130 was deposited by PVD to a thickness of about 100 Å directly on a NiFe layer. The NiFe layer was deposited by PVD to a thickness of about 50 Å on a thermal oxide coated Si wafer. A BiSb layer 1140 was deposited by PVD to a thickness of about 100 Å directly on a CuAgNi layer. The CuAgNi layer was deposited by PVD to a thickness of about 10 Å directly on a NiFe layer. The NiFe layer was deposited by PVD to a thickness of about 20 Å over a thermal oxide coated silicon substrate. A BiSb layer 1150 was deposited by PVD to a thickness of about 100 Å directly on a NiFe layer. The NiFe layer was deposited to a thickness of about 6 Å by PVD over a PVD deposited amorphous Si layer having a thickness of about 30 Å over a thermal oxide coated silicon substrate. A BiSb layer 1160 was deposited by PVD to a thickness of about 100 Å over a Co seed layer. The Co seed layer was deposited by PVD to a thickness of about 3 Å over a PVD deposited Co/Pt laminate. The Co/Pt laminate was a multilayered stack of Pt over Co of Co 3 Å/Pt 5 Å/Co 3 Å/Pt 5 Å. The Co/Pt laminate was deposited over a Pt pre-seed layer. The Pt pre-seed layer was deposited by PVD to a thickness of about 15 Å onto a thermal oxide coated Si wafer. A BiSb layer 1170 was deposited by PVD to a thickness of about 100 Å over a CuAgNi layer deposited by PVD to a thickness of about 5 Å thick over a NiFe layer deposited by PVD to a thickness of about 7 Å over an amorphous Si layer deposited to a thickness of about 20 Å.

Figure 9:
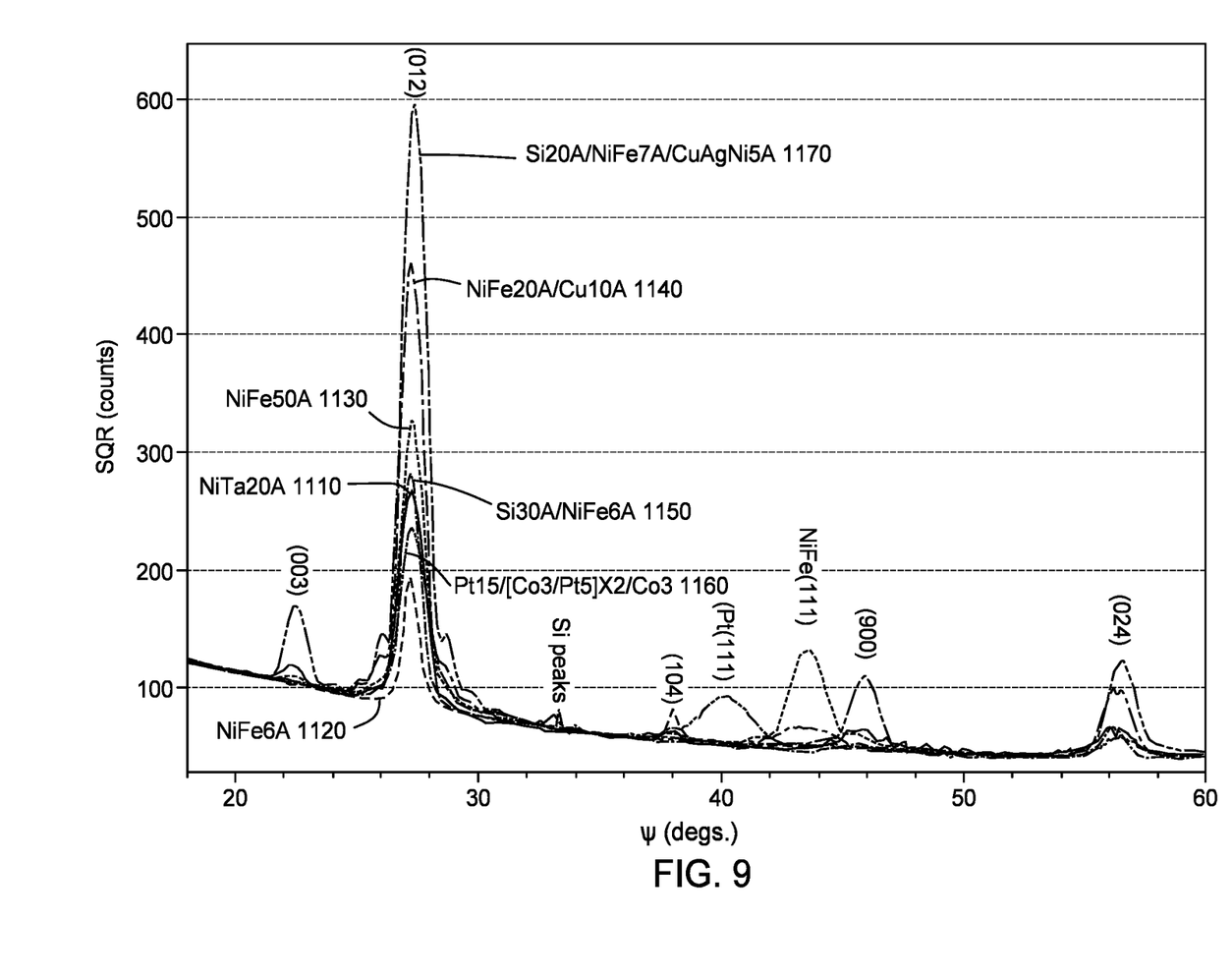

FIG. 9 illustrates XRD 2Θ scans of the BiSb layers 1110, 1120, 1130, 1140, 1150, 1160, 1170. The BiSb layers 1110, 1120, 1130, 1140, 1150, 1160, 1170 showed a (012) surface orientation.

It is estimated that a SOT MRAM device 600 of FIG. 6 formed of a BiSb layer 620 comprising a BiSb layer with (012) surface orientation as disclosed in Examples A, B, and C has a switching current density of about 110 MA/cm$^2$ or less, such as 100 MA/cm$^2$ or less. The switching current density is estimated from a BiSb layer 620 forming a 170 nm wide SOT track with a 60 nm circular MTJ.

Example D

A shunt block layer was deposited by PVD. The compositions and properties of each shunt block layer are shown in TABLE 2.

TABLE 2

| Layer | ρ(μOhm*cm) | MS (emu/cm$^3$) | $H_C$ (Oe) | Hk (Oe) |
|---|---|---|---|---|
| FeCo25 | 16 | 1900 | 9 | 63 |
| Co$_{19.5}$Fe$_{53}$Hf$_8$O$_{19.5}$ | 3569 | 1580 | 2 | 84 |
| Fe$_{40}$Co$_{25}$B$_{20}$ | 120 | 1000 | 22 | |

While the foregoing is directed to embodiments of the present disclosure, other and further embodiments of the disclosure may be devised without departing from the basic scope thereof, and the scope thereof is determined by the claims that follow.

What is claimed is:
1. A spin-orbit torque (SOT) magnetic tunnel junction (MTJ) device, comprising:
   a substrate;
   a buffer layer formed over the substrate, the buffer layer comprising:
   a pre-seed layer over the substrate, the pre-seed layer comprising a material selected from a group consisting of NiTa, NiFeTa, CoZrTa, NiNb, NiFeTa, NiFeW, CoHf, CoFeHf, CoFeHfB, NiFeB, CoFeB,

Ge, Co, CoFe, NiCr, Ni, Cu, NiFe, Ru, Pt, Rh, silicon oxide, aluminum oxide, magnesium oxide, TiN, AlN, and alloys thereof;

a seed layer over the pre-seed layer, the seed layer comprising a material selected from a group consisting of Co, CoFe, Ni, NiFe, NiCr, NiTa, NiFeTa, Cu, CuAgNi, RuX, CuX, CuNiX, CoFeX, CoNiX, FeX, NiX, and CoX, wherein X is selected from the group consisting of Cr, Ag, Pt, Ir, Rh, and combinations thereof; and a crystalline layer over the seed layer, the crystalline layer comprising a material selected from a group consisting of Co, CoFe, Ni, NiFe, NiCr, NiTa, NiFeTa, Cu, CuAgNi, RuX, CuX, CuNiX, CoFeX, CoNiX, FeX, NiX, and CoX, wherein X is selected from the group consisting of Cr, Ag, Pt, Ir, Rh, and combinations thereof; and a bismuth antimony (BiSb) layer formed over the buffer layer, the BiSb layer having a (012) orientation.

2. The SOT MTJ device of claim 1, wherein the pre-seed layer comprises a material selected from a group consisting of NiTa, NiFeTa, NiCr, Co, CoFe, Cu, NiFe, and alloys thereof.

3. The SOT MTJ device of claim 1, wherein the crystalline layer comprises a material selected from a group consisting of Co, CoFe, Ni, NiFe, Cu, CuNiAg, and alloys thereof.

4. The SOT MTJ device of claim 1, wherein the material of the seed layer and the material of the crystalline layer have a (111) orientation with an a-axis from about 3.52 Å to about 3.71 Å.

5. The SOT MTJ device of claim 1, wherein the material of the seed layer and the material of the crystalline layer have a (002) orientation with an a-axis from about 2.49 Å to 2.62 Å.

6. The SOT MTJ device of claim 1, wherein the BiSb layer comprises antimony in an atomic percent content from about 5% to about 20%.

7. The SOT MTJ device of claim 1, wherein the substrate is selected from a group consisting of silicon and alumina.

8. The SOT MTJ device of claim 1, further comprising an electrical current shunt blocking layer comprising a magnetic material.

9. The SOT MTJ device of claim 8, wherein the magnetic material of the electrical current shunt blocking layer is selected from a group consisting of FeCo, FeCoM, FeCoMO, FeCoMMeO, FeCoM/MeO stack, FeCoMN-iMnMgZnFeO, FeCoM/NiMnMgZnFeO stack, multiple layers thereof, multiple stacks thereof, and combinations thereof in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr.

10. A microwave assisted magnetic recording (MAMR) write head, comprising:
a main pole and a trailing shield; and
a spin-orbit torque (SOT) device disposed in a gap between the main pole and the trailing shield, the SOT device comprising:
a substrate;
a buffer layer formed over the substrate, wherein the buffer layer comprises:
a pre-seed layer over the substrate, the pre-seed layer comprising a material selected form a group consisting of NiTa, NiFeTa, CoZrTa, NiNb, NiFeTa, NiFeW, CoHf, CoFeHf, CoFeHfB, NiFeB, CoFeB, Ge, Co, CoFe, NiCr, Ni, Cu, NiFe, Ru, Pt, Rh, silicon oxide, aluminum oxide, magnesium oxide, TiN, AlN, and alloys thereof;

a seed layer over the pre-seed layer, the seed layer comprising a material selected from a group consisting of Co, CoFe, Ni, NiFe, NiCr, NiTa, NiFeTa, Cu, CuAgNi, RuX, CuX, CuNiX, CoFeX, CoNiX, FeX NiX, and CoX, wherein X is selected from the group consisting of Cr, Ag, Pt, Ir, Rh, and combinations thereof; and a crystalline layer over the seed layer, the crystalline layer comprising a material selected from a group consisting of Co, CoFe, Ni, NiFe, NiCr, NiTa, NiFeTa, Cu, CuAgNi, RuX, CuX, CuNiX, CoFeX, CoNiX, FeX NiX, and CoX, wherein X is selected from the group consisting of Cr, Ag, Pt, Ir, Rh, and combinations thereof;

a bismuth antimony (BiSb) layer over the buffer layer, wherein the BiSb layer has a (012) orientation and is a spin Hall layer; and a spin torque layer formed over the BiSb layer.

11. The MAMR write head of claim 10, wherein the crystalline layer comprises a material selected from a group consisting of Co, CoFe, Ni, NiFe, Cu, CuNiAg, and alloys thereof.

12. The MAMR write head of claim 10, further comprising an electrical current shunt blocking layer between the BiSb layer and the spin torque layer, the electrical current shunt blocking layer comprising a magnetic material.

13. The MAMR write head of claim 12, wherein the electrical current shunt blocking layer comprises a magnetic material selected from a group consisting of FeCo, FeCoM, FeCoMO, FeCoMMeO, FeCoM/MeO stack, FeCoMN-iMnMgZnFeO, FeCoM/NiMnMgZnFeO stack, multiple layers thereof, multiple stacks thereof, and combinations thereof in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr.

14. A magnetic media drive comprising the MAMR write head of claim 10.

15. The MAMR write head of claim 10, wherein the material of the seed layer and the material of the crystalline layer have a (111) orientation with an a-axis from about 3.52 Å to about 3.71 Å.

16. A magnetoresistive random access memory (MRAM) device, comprising
a recording layer;
a buffer layer formed over the recording layer, wherein the buffer layer comprises:
a pre-seed layer over the recording layer, the pre-seed layer comprising a material selected form a group consisting of NiTa, NiFeTa, CoZrTa, NiNb, NiFeTa, NiFeW, CoHf, CoFeHf, CoFeHfB, NiFeB, CoFeB, Ge, Co, CoFe, NiCr, Ni, Cu, NiFe, Ru, Pt, Rh, silicon oxide, aluminum oxide, magnesium oxide, TiN, AlN, and alloys thereof;

a seed layer over the pre-seed layer, the seed layer comprising a material selected from a group consisting of Co, CoFe, Ni, NiFe, NiCr, NiTa, NiFeTa, Cu, CuAgNi, RuX, CuX, CuNiX, CoFeX, CoNiX, FeX NiX, and CoX, wherein X is selected from the group consisting of Cr, Ag, Pt, Ir, Rh, and combinations thereof; and a crystalline layer over the seed layer, the crystalline layer comprising a material selected from a group consisting of Co, CoFe, Ni, NiFe, NiCr, NiTa, NiFeTa, Cu, CuAgNi, RuX, CuX, CuNiX, CoFeX, CoNiX, FeX NiX, and CoX, wherein X is selected from the group consisting of Cr, Ag, Pt, Ir, Rh, and combinations thereof; and a bismuth antimony (BiSb) layer formed over the buffer layer, the BiSb layer having a (012) orientation.

17. The MRAM device of claim 16, wherein the crystalline layer comprises a material selected from a group consisting of Co, CoFe, Ni, NiFe, Cu, CuNiAg, and alloys thereof.

18. The MRAM device of claim 16, further comprising an electrical current shunt blocking layer between the buffer layer and the recording layer, the electrical current shunt blocking layer comprising a magnetic material.

19. The MRAM device of claim 18, wherein the electrical current shunt blocking layer comprises a magnetic material selected from a group consisting of FeCo, FeCoM, FeCoMO, FeCoMMeO, FeCoM/MeO stack, FeCoMNiMnMgZnFeO, FeCoM/NiMnMgZnFeO stack, multiple layers thereof, multiple stacks thereof, and combinations thereof in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr.

20. The MRAM device of claim 16, wherein the material of the seed layer and the material of the crystalline layer have a (002) orientation with an a-axis from about 2.49 Å to 2.62 Å.

* * * * *